United States Patent
Bauer et al.

(10) Patent No.: US 7,464,603 B2
(45) Date of Patent: Dec. 16, 2008

(54) SENSOR COMPONENT WITH A CAVITY HOUSING AND A SENSOR CHIP AND METHOD FOR PRODUCING THE SAME

(75) Inventors: Michael Bauer, Nittendorf (DE); Angela Kessler, Regensburg (DE); Wolfgang Schober, Amberg (DE); Alfred Haimerl, Sinzing (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/867,117

(22) Filed: Oct. 4, 2007

(65) Prior Publication Data
US 2008/0173097 A1    Jul. 24, 2008

Related U.S. Application Data

(63) Continuation of application No. PCT/DE2006/000540, filed on Mar. 27, 2006.

(30) Foreign Application Priority Data
Apr. 4, 2005    (DE)    .................. 10 2005 015 454

(51) Int. Cl.
*H01L 23/02* (2006.01)

(52) U.S. Cl. ..................... 73/754; 73/706; 257/678

(58) Field of Classification Search .................. 73/754, 73/706; 257/678
See application file for complete search history.

(56) References Cited

U.S. PATENT DOCUMENTS

| 5,045,436 | A | 9/1991 | Tieke et al. |
| 5,646,072 | A | 7/1997 | Maudie et al. |
| 5,948,991 | A | 9/1999 | Nomura et al. |
| 7,009,288 | B2 | 3/2006 | Bauer et al. |
| 2002/0062698 | A1* | 5/2002 | Baba et al. .................. 73/754 |
| 2003/0068496 | A1 | 4/2003 | Wei et al. |

(Continued)

FOREIGN PATENT DOCUMENTS

DE    4238113 A1    5/1994

(Continued)

OTHER PUBLICATIONS

Nils Heininger et al., "Fertigung von MID Bauteilen vom Rapid Prototyping bis zur Serie mit innovativer LDS-Technologie," Ricone Symposium, Oct. 1, 2003, Murnau, Germany; XP 002395995.

*Primary Examiner*—Andre J Allen
(74) *Attorney, Agent, or Firm*—Edell, Shapiro & Finnan, LLC

(57) ABSTRACT

A semiconductor sensor component including a housing with a cavity and a sensor chip and a method for producing the same are described herein. The housing includes an opening to the surroundings of the housing and the sensor chip includes a sensor region which faces the opening. The sensor chip is embedded in the cavity of the housing into a rubber-elastic layer with its rear side and its edge sides, where the rubber-elastic layer includes cleavable included organometallic or inorganic metallic complexes. The metals of the complexes lie in a freely accessible manner on the top side of the rubber-elastic layer and form metallic nuclei for wiring lines which electrically connect the sensor region of the sensor chip to contact pads in the cavity of the cavity housing.

15 Claims, 6 Drawing Sheets

U.S. PATENT DOCUMENTS

| | | |
|---|---|---|
| 2004/0021209 A1* | 2/2004 | Shiono et al. ............... 257/682 |
| 2005/0045358 A1 | 3/2005 | Arnold |
| 2006/0091522 A1 | 5/2006 | Bachmaier et al. |
| 2007/0045787 A1* | 3/2007 | Ino ........................... 257/666 |
| 2007/0069354 A1* | 3/2007 | Dangelmaier et al. ....... 257/678 |

FOREIGN PATENT DOCUMENTS

| | | |
|---|---|---|
| DE | 19740389 | 3/1999 |
| DE | 102004019428 A1 | 8/2005 |
| DE | 102004045854 A1 | 4/2006 |
| WO | 2004004006 A1 | 1/2004 |
| WO | 2006026951 A1 | 3/2006 |
| WO | 2006050709 A1 | 5/2006 |

\* cited by examiner

SENSOR COMPONENT WITH A CAVITY HOUSING AND A SENSOR CHIP AND METHOD FOR PRODUCING THE SAME

CROSS REFERENCE TO RELATED APPLICATIONS

This application is a continuation of International Application No. PCT/DE2006/000540, filed on Mar. 27, 2006, entitled "Semiconductor Sensor Component with a Cavity Housing and Sensor Chip and Method for the Production Thereof," which claims priority under 35 U.S.C. §119 to Application No. DE 102005015454.9 filed on Apr. 4, 2005, entitled "Semiconductor Sensor Component with a Cavity Housing and Sensor Chip and Method for the Production Thereof," the entire contents of which are hereby incorporated by reference.

BACKGROUND

Semiconductor sensor components which comprise a sensor chip with a sensor region arranged in a cavity of a cavity housing, the cavity including an opening open to the surroundings of the housing, are known. These known semiconductor sensor components have the problem that the sensor chip is fixed in the cavity housing by adhesive bonding in such a way that repercussions of the mechanical loadings of the rigid cavity housing, such as thermal strains or vibration loadings, affect the sensor chip and in part corrupt the measurement results. Sensor chips of this type are protected from the surroundings by a soft material in the cavity housing in order to protect at least the top side with the sensor region of the semiconductor sensor chip against additional loadings.

Given almost complete mechanical decoupling through the use of adhesives having a low modulus of elasticity, the reliability of the sensor chip also depends on the fluctuations in the adhesive quality of the adhesive with which the sensor chip is fixed on the base of the rigid cavity housing. In this case, resonant vibration of the sensor chip can occur particularly when fitting bonding wires. Manufacturing-dictated prior damage to the semiconductor chip or a reduced bonding quality or an NSOP (non stick on pad) thus cannot be ruled out as a consequence, which impairs the reliability of the sensor chip. Moreover, the different coefficients of thermal expansion of the different materials cause losses of yield, on account of mechanical stresses in the sensor chip itself.

SUMMARY

Described herein is a semiconductor sensor component including a cavity housing and a sensor chip. The cavity housing includes an opening open to the surroundings of the housing, and the sensor chip comprises a sensor region. The sensor region faces the opening in the cavity housing. Likewise, a method for producing a semiconductor sensor component is described herein. The cavity housing comprises an opening that is open to the surroundings of the housing and the sensor chip comprises a sensor region which faces the opening. The sensor chip is embedded in the cavity of the housing into a rubber-elastic layer with its rear side and its edge sides, wherein the rubber-elastic layer comprises cleavable included organometallic or inorganic metallic complexes. The metals of the complexes lie in a freely accessible manner on the top side of the rubber-elastic layer and form metallic nuclei for wiring lines which electrically connect the sensor region of the sensor chip to contact pads disposed in the cavity of the cavity housing.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION

Figure 1:
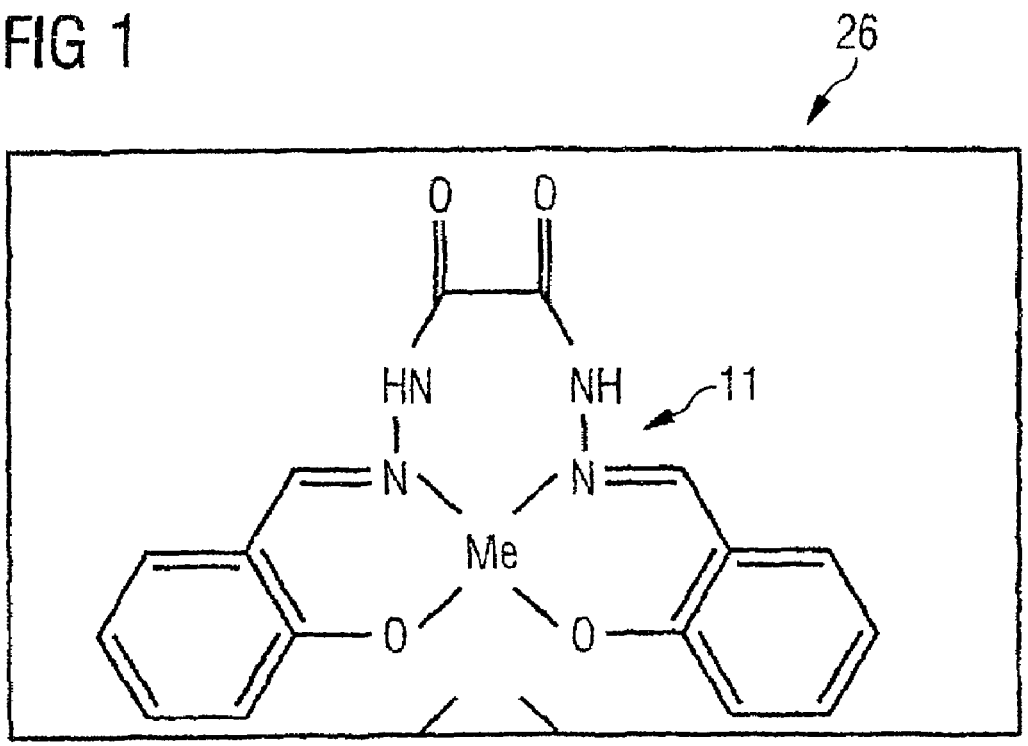
FIG. 1 shows an excerpt from a structural formula of an organometallic compound.

Described herein is a semiconductor sensor component including a cavity housing and a sensor chip. The cavity housing includes an opening open to the surroundings of the housing, and the sensor chip comprises a sensor region. The sensor region faces the opening in the cavity housing. Likewise, a method for producing a semiconductor sensor component is described herein. Advantages of the semiconductor sensor component and the method for the production thereof include: first, the yield in the production of the semiconductor sensor components is improved and second, the reliability of semiconductor sensor components of this type in practice in everyday measurement is increased.

The components include a sensor chip with sensor region. The cavity housing comprises an opening open to the surroundings of the housing. The sensor region of the sensor chip faces the opening. In this case, the sensor chip is embedded in the cavity of the housing into a rubber-elastic layer with its rear side and its edge sides. The rubber-elastic layer has cleavable included organometallic or inorganic metal-containing complexes. The metals of the complexes are uncovered at the top side of the rubber-elastic layer and form nuclei for wiring lines. In this case, the wiring lines on the rubber-elastic material with metal-containing complexes connect the sensor region of the sensor chip to contact pads in the cavity of the cavity housing. The top sides of the components within the cavity housing are protected by a rubber-elastic covering layer.

This semiconductor sensor component has the advantage that it comprises no metallic bonding wires, but rather wiring lines on nuclei of metallic complexes. The metallic complexes are contained in the rubber-elastic composition and have their metallic portions liberated on the top side of the rubber-elastic layer. Without any mechanical loading such as, in the case of bonding wire connections, wiring lines are formed on the nuclei. Prior damage such as can occur in the bonding wire technique is thus overcome. Faults which occur during conventional bonding, such as NSOP, are avoided and the decoupling of the sensor chip from the rigid cavity housing is improved further since the wiring lines according to the invention are more compliant than conventional bonding wires.

In one exemplary embodiment, the rubber-elastic layer comprises a silicone rubber. Silicone rubber has the advantage that it can be mixed with cleavable organometallic complexes or with inorganic metal-containing complexes and thus provides a rubber-elastic layer comprising corresponding inclusions.

In another exemplary embodiment, the cleavable included organometallic or the inorganic metal-containing complexes are arranged in a photosensitive lithographically patternable resist layer. The resist layer is arranged on the top side of the components in the cavity of the semiconductor sensor component and can be converted after patterning and corresponding cleavage of the complexes into metallic constituents and residues, such that the patterned photoresist layer then provides nuclei for the application of the wiring lines.

It is furthermore provided that the sensor chip is electrically connected to external connections of the semiconductor sensor component via the wiring line and via through contacts through the cavity housing. This exemplary embodiment has the advantage that bonding wires for producing connections to external connections of the semiconductor sensor chip can be obviated. In this case, the cavity housing comprises at least one base and side walls which delimit the cavity. For this purpose, the rubber-elastic layer with included organometallic or organic metal-containing complexes can be arranged on the base. This has the advantage that the sensor chip neither touches the cavity base nor is it fixed directly on the cavity base. Consequently, the sensor chip is almost completely decoupled mechanically from the rigid cavity housing with its base region via the rubber-elastic layer.

In one exemplary embodiment, the included organometallic or inorganic metal-containing complexes comprise at least one metal selected from the group including: copper, nickel, palladium, cobalt, magnesium, platinum, iridium and silver. These metals of the included cleavable organometallic complexes or inorganic metal-containing complexes can be uncovered via UV irradiation, laser irradiation and/or x-ray irradiation.

In a further exemplary embodiment, the rubber-elastic covering layer on the top sides of the components in the cavity of the cavity housing comprises an optically transparent elastomer. This optical transparency is particularly advantageous for optical sensor chips since it allows optical radiation to pass through unimpeded.

It is furthermore provided that the walls and the base of the cavity housing comprise a plastic housing composition filled with ceramic particles. The ceramic particles have the advantage that the plastic housing composition can be formed in relatively rigid fashion.

A method for the production of a semiconductor sensor component with a cavity housing and a sensor chip with a sensor region, the sensor chip being arranged in the cavity of the housing, includes the following method steps.

The first step involves producing a cavity housing with internal conductor tracks, which comprise contact pads. In addition, the cavity housing comprises external connections, which are electrically connected to the internal conductor tracks. Furthermore, the cavity housing includes a cavity base and also side walls surrounding the cavity base. The base of the cavity of the cavity housing is filled with a rubber-elastic layer comprising cleavable included organometallic or inorganic metal-containing complexes. The sensor chip is then embedded with its rear side and its edge sides into the rubber-elastic layer. This is followed by irradiating the top side of the rubber-elastic layer while cleaving the complexes and while liberating the complex metals selectively while forming patterned metallic nucleation layers for wiring lines.

This is followed by selective cleavage of metals on the patterned nucleation layers to form wiring lines between the sensor region of the sensor chip and contact pads of the internal conductor tracks of the cavity housing. After producing the wiring lines directly on the nucleation layer at the top side of the rubber-elastic layer, a rubber-elastic covering layer is applied to the top sides of the components in order to protect the top sides of the components in the cavity of the cavity housing.

This method has the advantage that during the production of the wiring lines, no mechanical loadings whatsoever are applied to the semiconductor sensor chip or to the rubber-elastic mounting of the semiconductor sensor chip. Rather, the top side of the rubber-elastic layer itself is used in order to serve as a carrier for the wiring lines.

In an alternative method, the rubber-elastic layer is only used as a carrier and a photolithographic layer is applied to the top sides of the components in the cavity, wherein the photosensitive layer comprises the cleavable included organometallic or organic metal-containing complexes, such that already during the patterning of the photolithographic layer with the aid of a photolithographic method, optionally with UV irradiation, the cleavable complexes release or liberate their complex metals, such that these form metallic nuclei for wiring lines to be subsequently applied.

Optionally, for producing a cavity housing with internal conductor tracks and external connections, first a leadframe with a plurality of housing positions is produced. Afterwards, the side walls and the base are applied in the housing positions via an injection-molding technology. This method of using leadframes and producing cavity housings has the advantage that cavity housings of this type are able to be produced in a mass production method. After the cavity housings have been produced, the base of the cavity of the cavity housing can be filled with a rubber-elastic layer via a dispensing technology.

In a further exemplary method, the selective irradiation of the top side of the rubber-elastic layer and a cleavage of the complexes and an uncovering of the complex metals to form patterned metallic nucleation layers for electrical wiring lines are carried out via a laser writing beam. Further optional methods for a selective irradiation use a UV irradiation or an x-ray irradiation through a correspondingly patterned mask. What type of irradiation is chosen depends on the wavelength at which the complexes release their complex metals the most effectively. The metallic particles produced by the energy input serve as condensation nuclei for the subsequent electrodeposition or electroless deposition process of wiring lines. In this case, a conductive electrical connection between the sensor region and the contact pads of the internal conductor tracks of the plastic housing arises along the exposed or irradiated section.

To summarize, it can be established that the subject matter according to the exemplary embodiments of the sensor component and the method has the following advantages.

1. The sensor chip can be fixed with a material which has an extremely low modulus of elasticity and thus has rubber-elastic properties.

2. A batch process with an exposure mask is possible, particularly in the event of UV irradiation or x-ray irradiation.

3. Furthermore, significantly smaller cavity housings and packages of the semiconductor chips in the cavity housing are possible.

4. In general, all metals which form complexes or compounds that are stable yet cleavable upon intensive irradiation are suitable for the metal complexes.

In the following paragraphs, exemplary embodiments of the device and method are described in connection with the figures.

FIG. 1 shows an excerpt from a partial region of a structural formula of an organometallic compound 26, wherein the metal ion is denoted by Me. The metals copper, nickel, palladium, cobalt, magnesium, platinum, iridium and/or silver are appropriate as metals Me for the present invention. In general, those metals Me which form metal complexes 11 that are stable yet cleavable upon intensive irradiation can be used. The metal ions are then liberated as metals Me by irradiation. Instead of the organometallic compounds 26 shown in FIG. 1, inorganic metal-containing complexes or else metallic particles and/or carbon nanoparticles such as fullerenes and/or carbon nanotubes can be used as electrically conductive inclusions into a plastic housing composition for the purpose of forming nuclei for wiring lines with electrically conductive positions isolated from one another.

Figure 2:
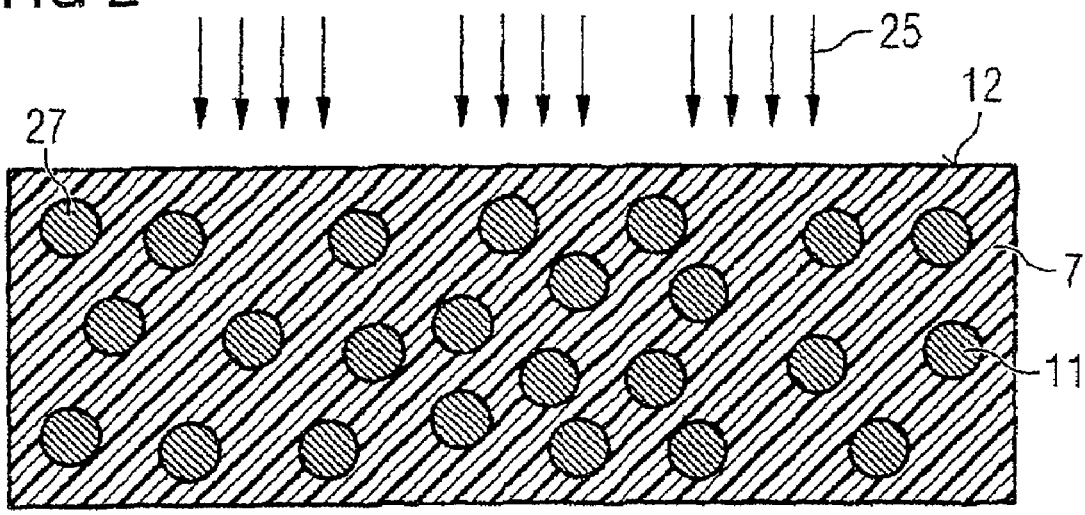
FIG. 2 shows a basic schematic diagram of a rubber-elastic layer with electrically conductive inclusions under the action of irradiation.

FIG. 2 shows a basic schematic diagram of a rubber-elastic layer 7 with inclusions of metal-containing complexes 11 under the action of an irradiation 25. The circular complexes 11 introduced symbolically do not represent the true structure of the included metal-containing complexes 11, rather FIG. 2 merely illustrates that the complexes 11 are arranged in a distributed manner isolated from one another in the rubber-elastic layer 7. The rubber-elastic layer 7 forms the plastic in which a sensor chip can be embedded with its rear side and its edge sides. The irradiation 25 can be a photon irradiation which can cleave for example metals from an organometallic compound or inorganic metal-containing complexes 11.

The irradiation 25 can also have the effect that the rubber-elastic layer 7 is removed from the top side 12 until conductive positions 27 are uncovered on the top side 12 of the rubber-elastic layer 7. This uncovering of conductive positions 27 predefines on the top side 12 a structure which can subsequently be converted into a wiring line along the uncovered electrically conductive positions 27 by reinforcing and enlarging the conductive positions 27.

Figure 3:
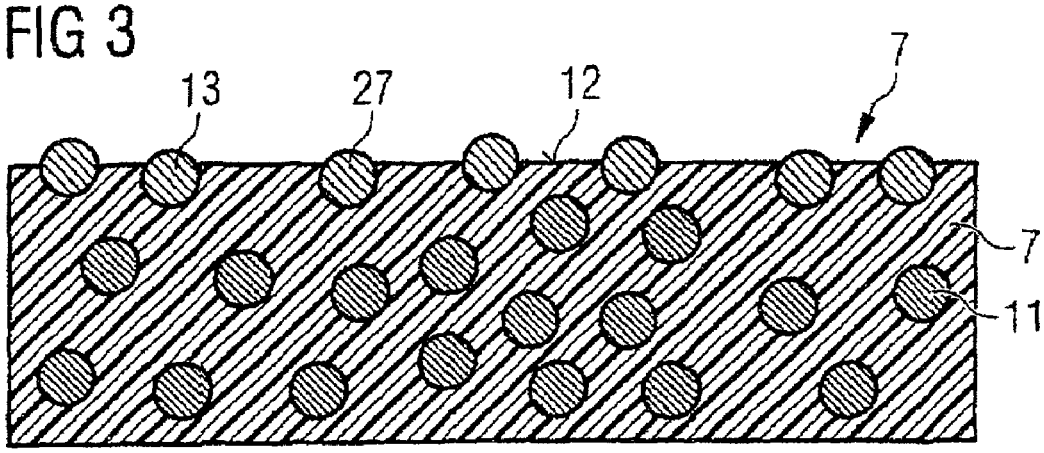
FIG. 3 shows a basic schematic diagram of the rubber-elastic layer, in accordance with FIG. 2, after the uncovering of electrically conductive inclusions as conductive positions on a top side of the rubber-elastic layer.

FIG. 3 shows a basic schematic diagram of the rubber-elastic layer 7, in accordance with FIG. 2, after the uncovering of electrically conductive inclusions as conductive positions 27 on a top side 12 of the rubber-elastic layer 7. For this purpose, via the irradiation 25 shown in FIG. 2, material of the rubber-elastic layer 7 is also removed and metallic nuclei 13 are simultaneously liberated.

Figure 4:
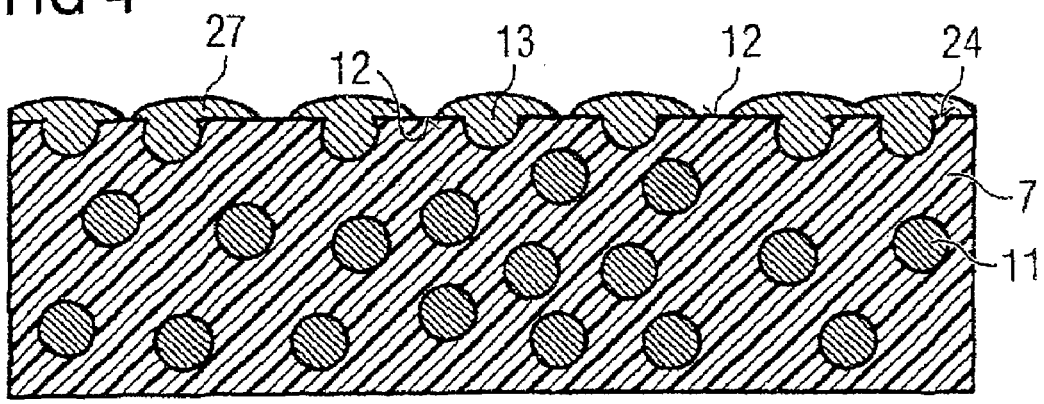
FIG. 4 shows a basic schematic diagram of the rubber-elastic layer, in accordance with FIG. 3, after a reinforcement of the electrically conductive positions to form an electrically conductive nucleation layer.

FIG. 4 shows a basic schematic diagram of a rubber-elastic layer 7, in accordance with FIG. 3, after a reinforcement of electrically conductive positions 27 to form an electrically conductive nucleation layer 24. This reinforcement of the electrically conductive positions 27 to form a thin, almost closed nucleation layer 24 or to form a lower metal layer can be effected by electroless chemical deposition of metals on the top side 12 of the rubber-elastic layer 7, provided that it has uncovered electrically conductive positions 27.

Figure 5:
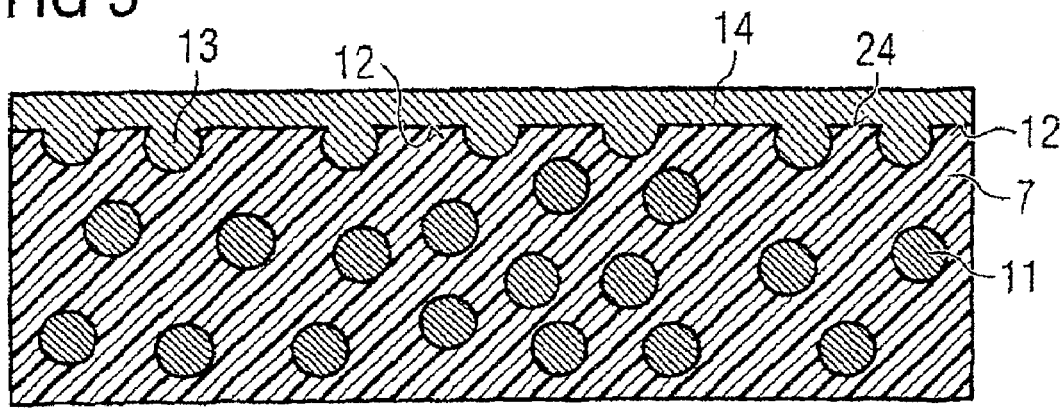
FIG. 5 shows a basic schematic diagram of the rubber-elastic layer, in accordance with FIG. 4, after the deposition of wiring lines on nuclei of the nucleation layer.

After the electrically conductive positions 27 have been reinforced in such a way that they form a closed, thin, conductive nucleation layer 24, this metal layer can be reinforced further to form wiring lines, as shown in FIG. 5. For this purpose, the regions of the top side 12 of the rubber-elastic layer 7 are covered with a protective layer in so far as they not intended to be reinforced to form wiring lines. A patterned protective layer of this type can be applied to the top side 12 of the rubber-elastic layer 7 by photolithography.

FIG. 5 shows a basic schematic diagram of the rubber-elastic layer 7, in accordance with FIG. 4, after the deposition of wiring lines 14 on the patterned nucleation layer 24, in accordance with FIG. 4. While FIG. 5 merely shows an excerpt from the rubber-elastic layer 7 on which wiring lines 14 of this type are formed, the subsequent figures show the production of a corresponding semiconductor sensor component.

Figure 6:
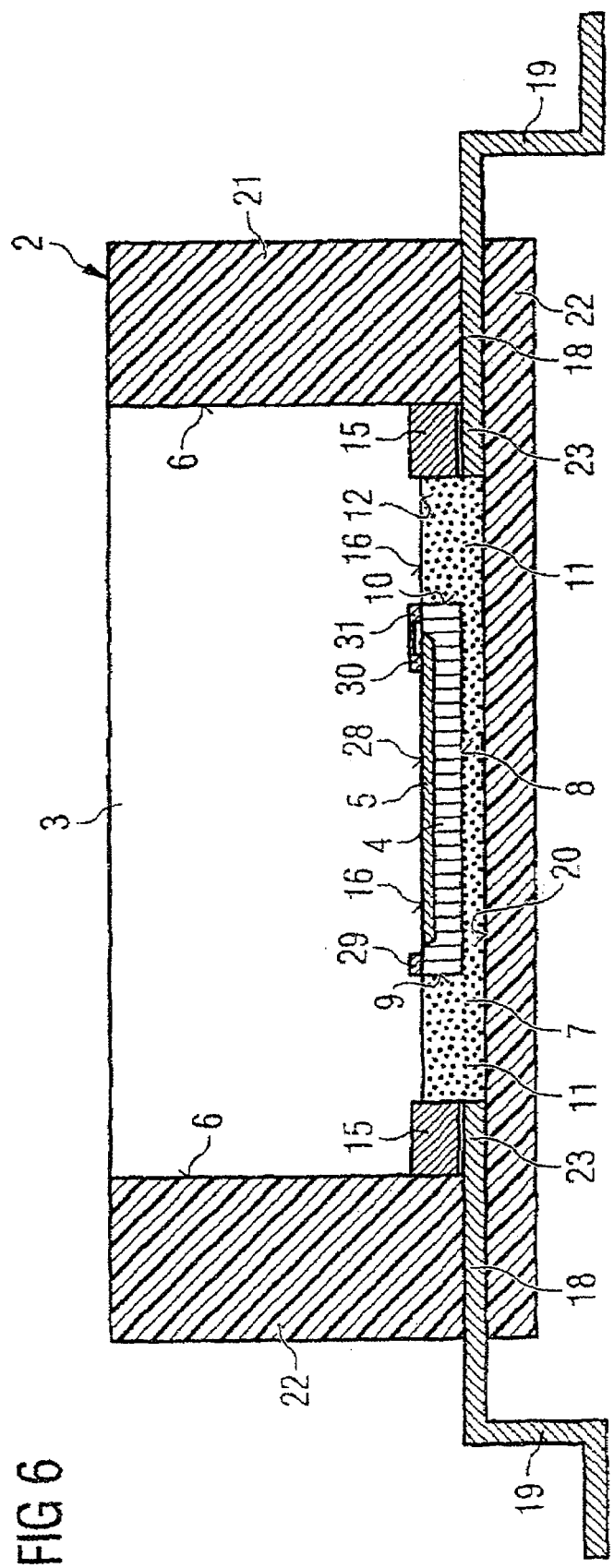
FIG. 6 shows a schematic cross section through a cavity housing with a sensor chip embedded into a rubber-elastic layer on the base of the cavity housing.

FIG. 6 shows a schematic cross section through a cavity housing 2 with a sensor chip 4 embedded into a rubber-elastic layer 7 on the base 20 of the cavity housing 2. The sensor chip 4 is embedded into the rubber-elastic layer 7 with its edge sides 9 and 10 and its rear side 8 in such a way that rubber-elastic material is arranged between the rear side 8 of the sensor chip 4 and the base 20 of the cavity 3, such that the sensor chip 4 is mechanically decoupled from the rigid cavity housing 2. The top side 28 of the sensor chip 4 is oriented in coplanar fashion with respect to the top side 12 of the rubber-elastic layer 7, which is in turn arranged in coplanar fashion with respect to contact pads 15 of the cavity housing 2.

Consequently, the top sides 16 of the components of the semiconductor sensor component form an intermediate plane above which only the contact pads 15 of the internal conductor tracks 23 and the contact areas 29 and 30 on the top side 28 of the sensor chip 4 project slightly. The contact areas 29 and 30 are led via conductor tracks 31 as far as the edges 9 and 10 of the sensor chip 4. An electrical connection between the edge sides 9 and 10 of the sensor chip 4 and the contact pads 15 of the cavity housing 2 does not yet exist in this manufacturing state. However, the rubber-elastic layer 7 comprises inclusions of metal-containing complexes 11 which can be uncovered by corresponding supply of energy via irradiation on the top side 12 of the rubber-elastic layer 7 to form metallic nuclei, wherein the complexes 11 are cleaved into metallic nuclei and residues.

Besides the housing base 8 carrying the contact pads 15 and through contacts 18 to external connections 19, the cavity housing 2 has side walls 21 surrounding the cavity 3. Both the base 20 and the side walls 21 comprise a plastic housing composition 22 with ceramic particles as filler. The side walls 21 and the base 20 form a relatively stiff cavity 3 in relation to the rubber-elastic layer 7. The sensor chip 4 comprises a central sensor region 5 directed at an opening 6 of the cavity 3.

Figure 7:
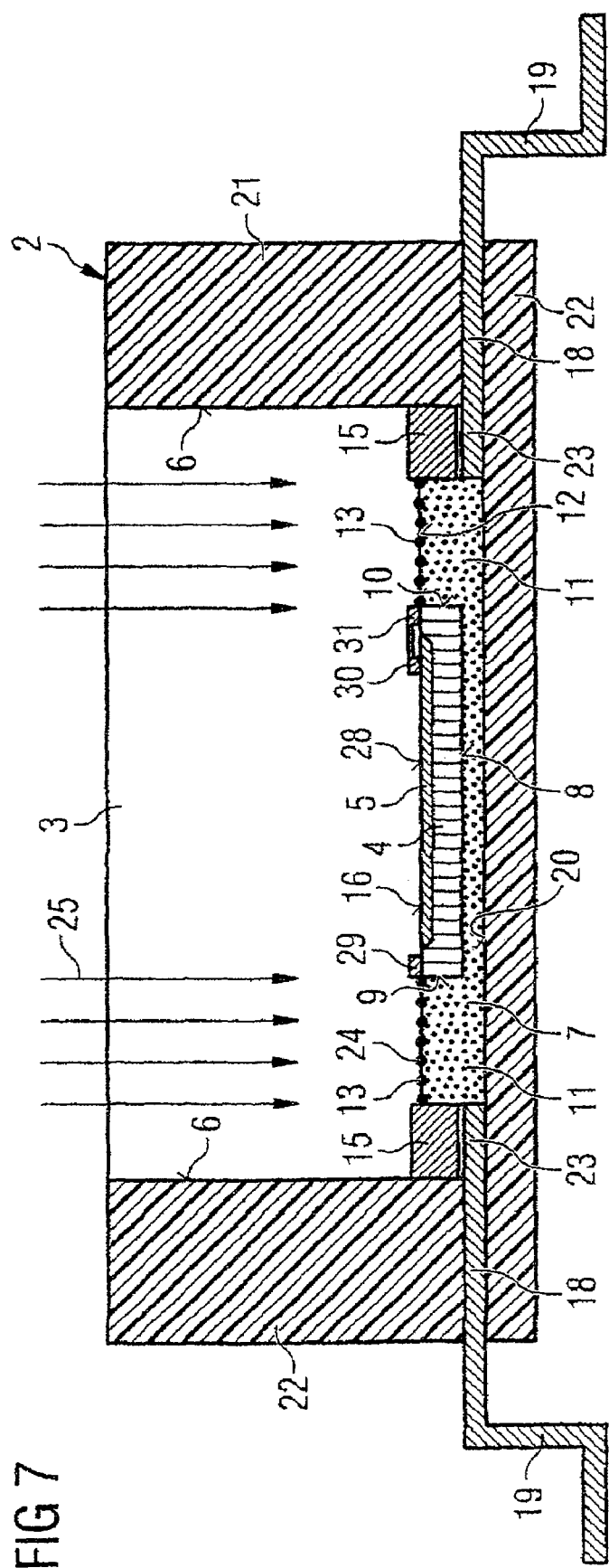
FIG. 7 shows a schematic cross section through the cavity housing, in accordance with FIG. 6, during a selective irradiation of the top side of the rubber-elastic layer for the purpose of forming metallic nuclei.

FIG. 7 shows a schematic cross section through the cavity housing 2, in accordance with FIG. 6, during a selective irradiation 25 of the top side 12 of the rubber-elastic layer 7 for the purpose of forming metallic nuclei 13. The irradiation 25 serves, on the one hand, to uncover the metallic complexes 11, which are contained in the rubber-elastic layer 7, on the top side 12 and to cleave them in such a way that metallic nuclei 13 are available on the top side 12 of the rubber-elastic layer 7 for wiring lines. By reinforcing the metal-containing complexes 11, the nuclei 13 can be densified and form a nucleation layer 24 as shown in FIG. 4. This thin nucleation layer 24 is optionally applied via sputtering technology.

Figure 8:
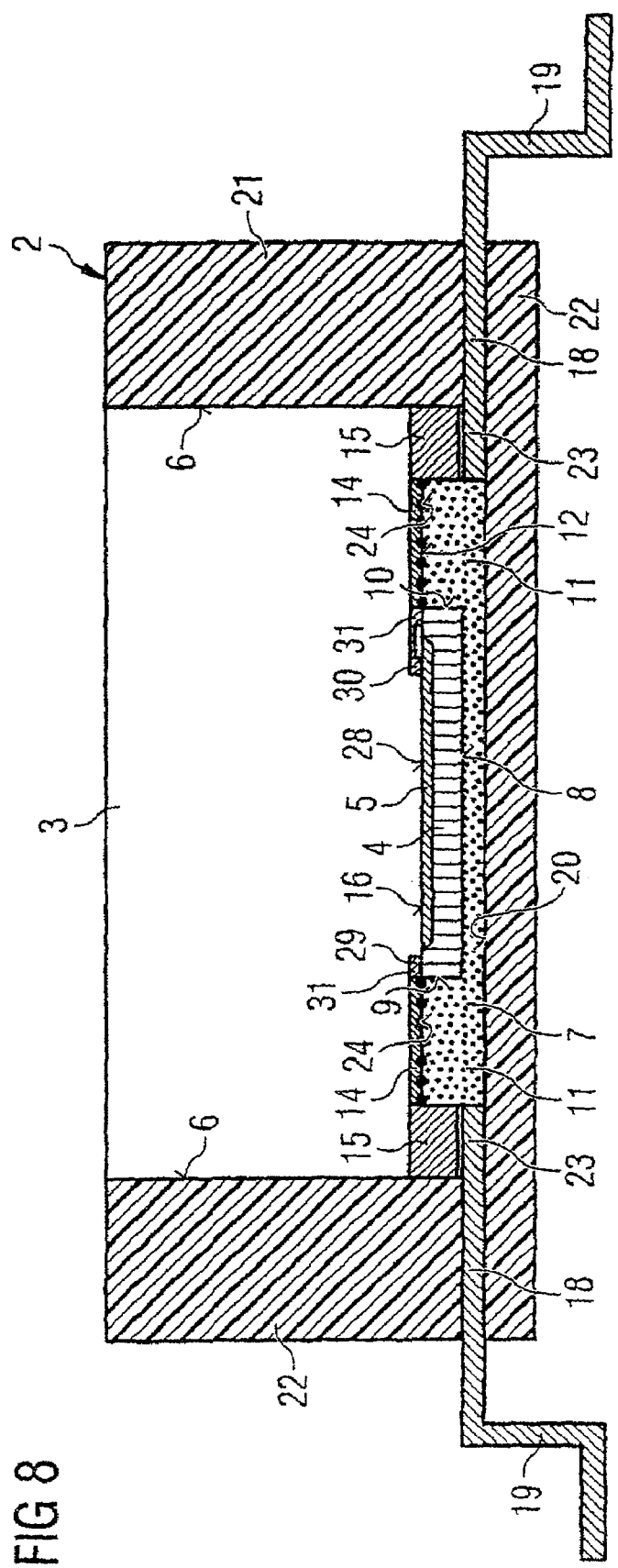
FIG. 8 shows a schematic cross section through the cavity housing, in accordance with FIG. 7, after the application of wiring lines on the metallic nuclei of the rubber-elastic layer.

FIG. 8 shows a schematic cross section through the cavity housing 2, in accordance with FIG. 7, after the application of wiring lines 14 to the metallic nucleation layer 24 of the rubber-elastic layer 7. An electrodeposition or else chemical deposition method of a conductive material can be used for producing the wiring lines 14. In this case, the lateral edges of the conductor tracks 31 on the sensor chip 4 are electrically connected to the edge sides of the contact pads 15 of internal conductor tracks 23, such that the sensor region 5 of the sensor chip 4 is now electrically connected to the external connections 19. The wiring lines 14 deposited on the rubber-elastic layer 7 are more compliant than the bonding wires used heretofore between the contact areas 29, 30 on the top side 28 of the sensor chip 4 and the contact pads 15 on the internal conductor tracks 23 of the cavity housing 2.

The method for applying the wiring lines 14 also takes place without expenditure of force in contrast to a bonding method, which raises considerable manufacturing-technological problems in the case of such mechanically decoupled sensor chips 4. Consequently, the provided method for the production of a semiconductor sensor component of this type improves the production output of functional semiconductor sensor components. A rubber-elastic covering can then be effected in order to protect the components within the cavity housing 2, which covering involves coating the top sides 16 of the components of the semiconductor sensor component with a covering layer.

Figure 9:
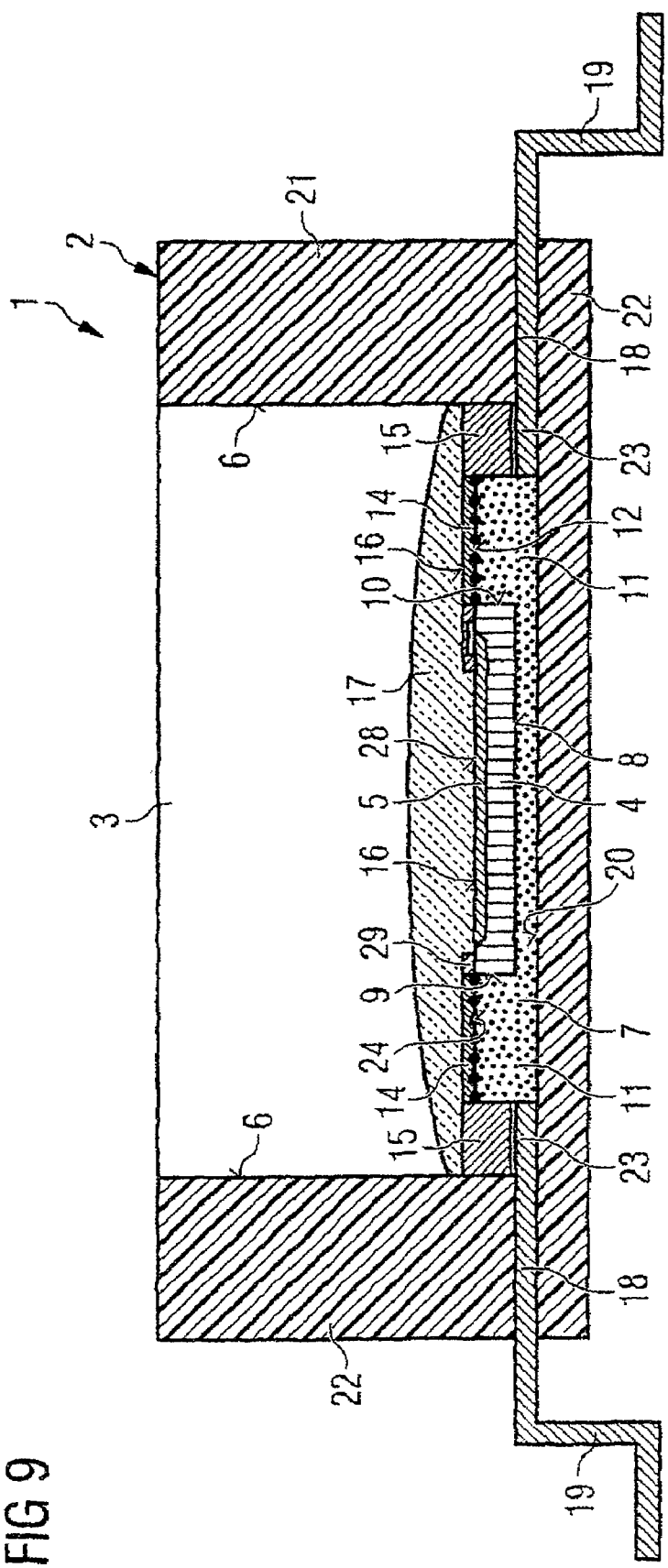
FIG. 9 shows a schematic cross section of a semiconductor sensor component after the application of a rubber-elastic covering layer to the top sides of the components in the cavity of the cavity housing, in accordance with FIG. 8.

FIG. 9 shows a schematic cross section of a semiconductor sensor component 1 after the application of a rubber-elastic covering layer 17 to the top side 16 of the components in the cavity 3 of the cavity housing 2, in accordance with FIG. 8. In this case, the covering layer 17 reaches from one side wall to the other side wall of the housing and simultaneously insulates the sensitive top sides 16 of the components from contamination by the surroundings. The covering layer 17 comprises a transparent, rubber-elastic plastic since, in this case, there is provided an optical semiconductor sensor component 1 with a sensor region 5 which reacts to optical signals and generates a photocurrent that is tapped off at the external connections 19 of the semiconductor sensor component 1 via through contacts 18 of the cavity housing 2. In the case of pressure sensors, the covering layer can also be covered by a non-transparent plastic, but it is advantageous to achieve the compliance of a rubber-elastic plastic layer for the covering layer 17 in order to decouple the mechanical loadings that act on the cavity housing 2 from the sensor chip 4.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A sensor component comprising:
   a housing including a cavity that is open to the surroundings of the housing;
   contact pads arranged in the cavity;
   a rubber-elastic layer comprising cleavable organometallic or inorganic metal-containing complexes disposed within the layer, wherein metals of at least some of the complexes are uncovered at a top side of the rubber-elastic layer and form metallic wiring nuclei of wiring lines along the top side of the rubber-elastic layer;
   at least one component arranged in the housing cavity and at least partially embedded within the rubber-elastic layer such that a rear side and edge sides of the at least one component are disposed within the rubber-elastic layer, the at least one component comprising a sensor chip with a sensor region disposed on a top side and facing an opening in the housing cavity, wherein the wiring lines electrically connect the sensor region of the sensor chip to the contact pads within the housing cavity; and
   a rubber-elastic covering layer arranged on the top side of each component within the housing cavity.

2. The sensor component of claim 1, wherein the rubber-elastic layer comprises silicone rubber.

3. The sensor component of claim 1, wherein the at least one component further comprises on its top side a photosensitive lithographically patterned resist layer comprising cleavable organometallic or inorganic metal-containing complexes disposed within the resist layer.

4. The sensor component of claim 1, wherein the rubber-elastic covering layer comprises an optically transparent elastomer.

5. The sensor component of claim 1, further comprising:
   external connections; and
   through contacts extending through the cavity housing;
   wherein the sensor chip is electrically connected to the external connections of the semiconductor sensor component via the wiring lines and the through contacts.

6. The sensor component of claim 1, wherein the housing further comprises:
   at least one base and side walls which delimit the cavity, wherein the rubber-elastic layer is arranged on the base.

7. The sensor component of claim 1, wherein the organometallic or inorganic metal-containing complexes comprise at least one of copper, nickel, palladium, cobalt, magnesium, platinum, iridium and silver.

8. The sensor component of claim 7, wherein the metals of the organometallic or inorganic metal-containing complexes are configured to be uncovered via at least one radiation process selected from the group consisting of UV irradiation, laser radiation and x-ray radiation.

9. The sensor component of claim 7, wherein the base and walls of the cavity housing comprise a plastic housing composition filled with ceramic particles.

10. A method for producing a sensor component comprising:
    producing a housing with a cavity and including internal conductor tracks and external connections electrically connected to the internal conductor tracks, the internal conductor tracks comprising contact pads, wherein the housing cavity is defined between a base of the housing and side walls of the housing that surround the housing base;
    filling the housing base with a rubber-elastic layer comprising cleavable organometallic or inorganic metal-containing complexes disposed within the rubber-elastic layer;
    embedding a sensor chip within the rubber-elastic layer disposed within the housing cavity such that a rear side and edge sides of the sensor chip are disposed within the rubber-elastic layer, the sensor chip including a sensor region;
    selectively irradiating a top side of the rubber-elastic layer to cleave at least some of the complexes disposed within the rubber-elastic layer and uncover metals within the cleaved complexes so as to form patterned metallic nucleation layers for wiring lines along the top side of the rubber-elastic layer;

selectively depositing metals on the patterned nucleation layers to form wiring lines between the sensor region of the sensor chip and the contact pads; and applying a rubber-elastic covering layer in the cavity of the cavity housing.

11. The method of claim 10, wherein producing the housing comprises:

producing a leadframe with a plurality of housing positions; and producing side walls and a base in each of the housing positions via an injection-molding process.

12. The method of claim 10, wherein the base of the cavity is filled with the rubber-elastic layer via a dispensing process.

13. The method of claim 10, wherein the top side of the rubber-elastic layer is selectively irradiated via a laser writing beam.

14. The method of claim 10, wherein the top side of the rubber-elastic layer is selectively irradiated via UV irradiation or x-ray irradiation through a patterned mask.

15. The method of claim 10, further comprising:

prior to selectively irradiating the top side of the rubber-elastic layer, coating a top side of the sensor chip in the housing cavity with a photosensitive lithographically patternable resist layer comprising cleavable organometallic or inorganic metal-containing complexes disposed within the resist layer; and patterning the resist layer photolithographically.

* * * * *